(12) United States Patent
Lefevre et al.

(10) Patent No.: US 9,291,458 B2
(45) Date of Patent: Mar. 22, 2016

(54) FIBER-OPTIC MEASUREMENT DEVICE, GYROMETER, AND NAVIGATION AND INERTIAL-STABILIZATION SYSTEM

(71) Applicants: Herve Lefevre, Paris (FR); Van-Dong Pham, Le Kremlin Bicetre (FR); Joachim Honthaas, Paris (FR)

(72) Inventors: Herve Lefevre, Paris (FR); Van-Dong Pham, Le Kremlin Bicetre (FR); Joachim Honthaas, Paris (FR)

(73) Assignee: IXBLUE, Saint-Germain-en-Laye (FR)

( * ) Notice: Subject to any disclaimer, the term of this patent is extended or adjusted under 35 U.S.C. 154(b) by 61 days.

(21) Appl. No.: 14/379,665

(22) PCT Filed: Feb. 20, 2013

(86) PCT No.: PCT/FR2013/050351
§ 371 (c)(1),
(2) Date: Aug. 19, 2014

(87) PCT Pub. No.: WO2013/124584
PCT Pub. Date: Aug. 29, 2013

(65) Prior Publication Data
US 2015/0009505 A1    Jan. 8, 2015

(30) Foreign Application Priority Data
Feb. 21, 2012   (FR) ...................................... 12 51541

(51) Int. Cl.
  *G01C 19/72*    (2006.01)
  *G01C 19/66*    (2006.01)
  *G01R 33/032*   (2006.01)

(52) U.S. Cl.
  CPC ............ *G01C 19/665* (2013.01); *G01C 19/662* (2013.01); *G01C 19/721* (2013.01); *G01C 19/726* (2013.01); *G01R 33/0322* (2013.01)

(58) Field of Classification Search
  CPC ......... G01C 19/00; G01C 19/64; G01C 19/72
  USPC .................................................. 356/460, 464
  See application file for complete search history.

(56) References Cited

U.S. PATENT DOCUMENTS

| 4,705,399 A | 11/1987 | Graindorge et al. |
| 5,141,316 A | 8/1992 | Lefevre et al. |

(Continued)

FOREIGN PATENT DOCUMENTS

| EP | 0 168 292 A1 | 1/1986 |
| EP | 0 430 747 A1 | 6/1991 |

(Continued)

OTHER PUBLICATIONS

Xuyou Li et al.: "Four-state modulation in fiber optic gyro", Mechatronics and Automation, 2008. ICMA 2008. IEEE International Conference on, IEEE, Piscataway, NJ, USA, Aug. 5, 2008, pp. 189-192, XP031435804, DOI: 10.1109/ICMA.2008.4798749 ISBN: 978-1-4244-2631-7 figures 1,3,4,5.

(Continued)

*Primary Examiner* — Jonathan Hansen
(74) *Attorney, Agent, or Firm* — Young & Thompson

(57) ABSTRACT

A fiber-optic measurement device (10) includes a SAGNAC ring interferometer (20) having a proper frequency $f_p$. The aim is to improve response time while maintaining high precision across the measurement range. Biasing elements (130) are used to produce: a first biasing phase-differential modulation component $\Delta\phi_{b1}(t)$ (34) which is periodic in time-slots, having levels $+\pi$ and $-\pi$, at a first biasing modulation frequency $f_{b1}$ such that $f_{b1}=(2k_1+1) f_p$, $k_1$ being a natural number; and a second periodic biasing phase-differential modulation component $\Delta\phi_{b2}(t)$ (35), having extreme amplitudes $+\pi/a$ and $-\pi/a$, a being a non-zero real number such that $|a|>1$, at a second biasing modulation frequency $f_{b2}$ such that $f_{b2}=(2k_2+1) f_p$, $k_2$ being a non-zero natural number such that $k_2>k_1$. A gyrometer including such a measurement device and a navigation or inertial-stabilization system including at least one such gyrometer are also described.

14 Claims, 5 Drawing Sheets

(56) References Cited

U.S. PATENT DOCUMENTS

| | | | |
|---|---|---|---|
| 5,181,078 A | 1/1993 | Lefevre et al. | |
| 5,337,142 A * | 8/1994 | Lefevre | G01C 19/721 356/464 |
| 7,777,890 B2 | 8/2010 | Urgell et al. | |
| 2009/0161112 A1 * | 6/2009 | Urgell | G01C 19/726 356/464 |

FOREIGN PATENT DOCUMENTS

| | | |
|---|---|---|
| EP | 0 455 530 A1 | 11/1991 |
| EP | 1 835 258 A2 | 9/2007 |
| FR | 2 899 681 A1 | 10/2007 |
| WO | 2012/008955 A1 | 1/2012 |

OTHER PUBLICATIONS

Shitong Chen et al.: "Research on the Digital Closed-loop Control of Fiber Optical Gyroscope", Computer and Automation Engineering, 2009, ICCAE '09. International Conference on, IEEE, Piscataway, NJ, USA, Mar. 8, 2009, pp. 103-107, XP031742088, ISBN: 978-0-7695-3569-2 figures 2,3,4,5.

International Search Report, dated Jun. 5, 2013, from corresponding PCT application.

* cited by examiner

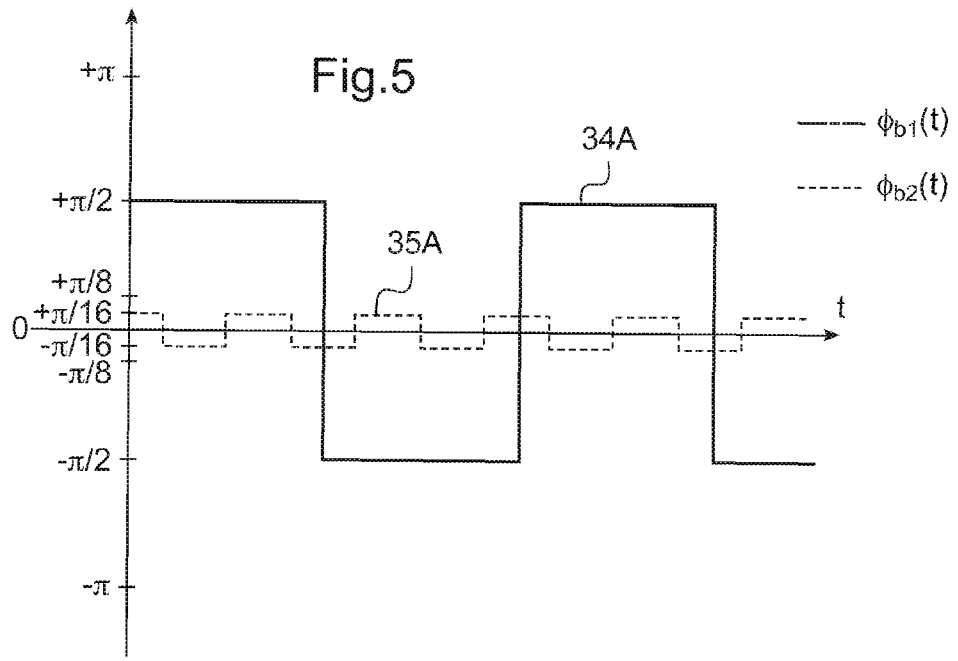
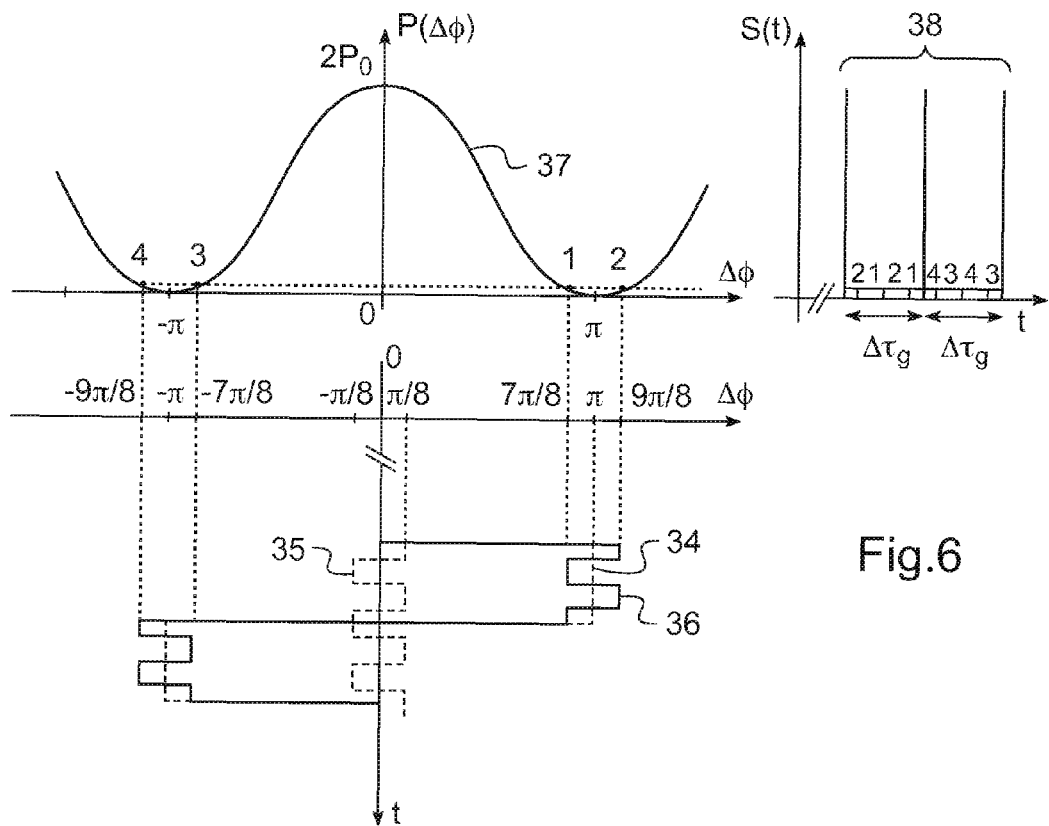

US 9,291,458 B2

FIBER-OPTIC MEASUREMENT DEVICE, GYROMETER, AND NAVIGATION AND INERTIAL-STABILIZATION SYSTEM

FIELD OF THE INVENTION

The invention relates to a fiber-optic measurement device allowing to measure the variation of a parameter that produces non-reciprocal disturbances in a SAGNAC ring interferometer.

BACKGROUND OF THE INVENTION

The SAGNAC interferometer and the physical phenomena involved thereby are well known. Reference may be made for example about that to "The Fiber-Optic Gyroscope", H. Lefèvre (Artech House, 1993).

In such an interferometer, a splitting plate or any other splitting device splits an incident wave at the input of the interferometer into two waves. The two thus-created waves are referred to as "counter-propagating waves". They indeed propagate in opposite directions along a same closed optical path, then recombine with each other, producing interferences at the time of their recombination. The interference state between the two counter-propagating waves then depends on the relative phase difference between them. The luminous power P measured at the output of a SAGNAC interferometer is of the form: $P(\Delta\phi)=P_0[1+\cos(\Delta\phi)]$, where $\Delta\phi$ is the relative phase difference between the two counter-propagating waves. Hence, the power measured at the output of the interferometer takes values between a minimum (it is then talked about "dark" fringe) and a maximum ("bright" fringe) as a function of the value of the phase difference $\Delta\phi$.

It is known that some physical phenomena are liable to introduce so-called non-reciprocal phase shifts, in the counter-propagating waves, hence generating a phase difference $\Delta\phi_p$ between these waves and modifying the interference state during the recombination thereof. Hence, the measurement of this non-reciprocal phase shift $\Delta\phi_p$ allows to quantify the phenomenon that has been generated thereby.

The main physical phenomenon liable to create non-reciprocal disturbances is the SAGNAC effect produced by the rotation of the interferometer about an axis perpendicular to the plane of its closed optical path. A second effect, the FARADAY effect—or collinear magneto-optic effect—is also known for producing non-reciprocal effects of this type.

It is known that a SAGNAC interferometer can include a fiber-optic coil, which is preferably single-mode and of the polarization-maintaining type. The multiple turns of an optical fiber form a closed optical path of very long length, up to several kilometers.

A proper frequency $f_p$ of the SAGNAC interferometer is commonly defined. The proper frequency $f_p$ of a SAGNAC ring interferometer including a single-mode fiber-optic coil (silica fiber having a refractive index close to 1.5 in the operating wavelength range) of 1 kilometer long is of the order of 100 kilohertz (kHz). The extension of the coil length and hence of the optical path has for advantage to provide the interferometer with a greater sensitivity.

Moreover, it has been shown that the measurement accuracy is improved by the use of a so-called "phase cancellation" method, also called closed-loop operation, instead of a simple open-loop operation.

According to this method, an additional so-called "feedback" phase difference $\Delta\phi_{cr}$ is introduced by means of a phase modulator between the two counter-propagating waves, so as to compensate for the phase shift $\Delta\phi_p$ produced by the parameter measured. The sum of the two phase-shifts $\Delta\phi_p$ and $\Delta\phi_{cr}$ is kept at zero, which allows to make the interferometer operate with a better accuracy. The measurement of the parameter to be measured is made thanks to the use of the signal necessary to the production of the feedback phase difference $\Delta\phi_{cr}$.

However, the sensitivity of the response $P(\Delta\phi)$ of the interferometer in the vicinity of the zero phase difference ($\Delta\phi=0$) is low, because the signal measured at the output of the interferometer is a cosine-wave function of the phase difference $\Delta\phi$.

It is known that it is possible to displace the operating point of the interferometer towards a point offering a greater sensitivity. It has notably been proposed to introduce an additional so-called "biasing" phase-difference modulation $\Delta\phi_b$, by means of the phase modulator. The total phase difference $\Delta\phi_t$ between the two counter-propagating waves is then equal to the sum of the different phase differences: $\Delta\phi_t=\Delta\phi_p+\Delta\phi_{cr}+\Delta\phi_b$.

A simple-to-implement solution to perform this biasing consists in a square-wave periodic modulation at a biasing modulation frequency $f_b$, the modulation having for example levels $+\pi/2$ and $-\pi/2$. This biasing phase-difference modulation $\Delta\phi_b$ produces at the output of the interferometer a square-wave periodic modulated electrical signal at the biasing modulation frequency $f_b$ whose amplitude is a sine-wave function of the sum of the two phase-shifts $\Delta\phi_p$ and $\Delta\phi_{cr}$, in the case of a closed-loop measurement as described above. The response provided by the SAGNAC interferometer can hence be used with a greater sensitivity.

Moreover, in order to improve the stability of the measurement of a non-reciprocal parameter by means of a SAGNAC interferometer, the document EP0430747 proposes a device in which the biasing phase-difference modulation MOO introduced between the two counter-propagating waves is periodic at the frequency $f_b$.

At each period of the modulation, the level of the phase-difference modulation $\Delta\phi_b(t)$ is hence equal to:

$\phi_0$ during the first quarter of period, $a\phi_0$ during the second quarter of period, $-\phi_0$ during the third quarter of period, and $-a\phi_0$ during the fourth quarter of period.

The values of a and $\phi_0$ are chosen so as to verify the relation: $\cos(\phi_0)=\cos(a\phi_0)$.

The device according to the document EP0430747 also includes a signal processing system using the four values taken by the modulated electrical signal delivered by the interferometer during one modulation period. The signal processing system then allows to maintain constant the gain of the modulation chain so as to compensate for the slow drifts of the different components of the device (for example: variation as a function of the temperature).

To reduce the effects of the modulation chain defects on the measurement, it is known that the biasing modulation frequency $f_b$ has to be equal to the proper frequency $f_p$ of the interferometer or to one of its odd multiples.

In particular, the so-called "four states" modulation generated by the biasing described in the document EP0430747 introduces defect-bearing peaks on the modulated electrical signal measured at the output of the interferometer, these defects being eliminated when the biasing modulation frequency $f_b$ is equal to the proper frequency $f_p$ of the SAGNAC interferometer, or to one of its odd multiples.

Moreover, the number of these peaks increases with the biasing modulation frequency $f_b$.

To reduce the response time of the interferometer and to ensure that the feedback loop of measurement does not break in case of a rapid variation of the parameter to be measured, the biasing modulation frequency $f_b$ is increased. However, the measurement accuracy is hence substantially degraded due to a greater number of peaks in the signal detected.

SUMMARY OF THE INVENTION

The object of the present invention is to propose a fiber-optic measurement device wherein a parameter to be measured generates a phase difference between two counter-propagating waves, wherein the response time is improved while keeping a good accuracy over the measurement range.

For that purpose, the invention relates to a fiber-optic measurement device of the type in which a parameter to be measured generates a phase difference $\Delta\phi_p$ between two counter-propagating waves, including:
- a light source,
- a fiber-optic SAGNAC ring interferometer, preferably single-mode, including a coil and a splitting element, in which said two counter-propagating waves propagate, said ring interferometer having a proper frequency $f_p$,
- an electromagnetic radiation detector, receiving the luminous power exiting from said ring interferometer and delivering a modulated electrical signal representative of the luminous power, which is function of the total phase difference $\Delta\phi_t$ between said two counter-propagating waves at the output of said ring interferometer,
- a modulation chain adapted to modulate said luminous power exiting from said ring interferometer, said modulation chain including:
  - at least one digital/analog converter adapted to process a digital control signal to deliver an analog control signal,
  - an amplifier adapted to process said analog control signal to deliver a modulation control voltage $V_m(t)$,
  - at least one phase modulator placed in said interferometer, which, when subjected at the input to said modulation control voltage $V_m(t)$, is adapted to generate at the output a phase-shift modulation $\phi_m(t)$, said phase-shift modulation $\phi_m(t)$ introducing between said two counter-propagating waves a phase-difference modulation $\Delta\phi_m(t)$ such that: $\Delta\phi_m(t)=\phi_m(t)-\phi_m(t-\Delta\tau_g)$, $\Delta\tau_g=1/(2f_p)$ being the transit-time difference between said two counter-propagating waves determined between said phase modulator and said splitting element, and
- signal processing means including:
  - an analog/digital converter digitizing said modulated electrical signal received from the detector and representative of said power received to deliver a digital electrical signal, and
  - a digital processing unit adapted to process said digital electrical signal to deliver a signal function of said phase difference $\Delta\phi_p$ and of said parameter to be measured,
- feedback means adapted to process said signal function of said phase difference $\Delta\phi_p$ to generate a feedback signal,
- biasing means adapted to generate a biasing signal,
- means for controlling said modulation chain, adapted to process said feedback signal and said biasing signal to deliver said digital control signal at the input of said modulation chain, such that said modulation control voltage $V_m(t)$ at the input of said phase modulator is the sum of a feedback modulation voltage $V_{cr}(t)$ and a biasing modulation voltage $V_b(t)$, said phase modulator being adapted, when it is subjected to said feedback modulation voltage $V_{cr}(t)$, to generate a feedback phase-shift modulation $\phi_{cr}(t)$, said feedback phase-shift modulation $\phi_{cr}(t)$ introducing a feedback phase-difference modulation $\Delta\phi_{cr}$ between said two counter-propagating waves allowing to keep at zero the sum of said phase difference $\Delta\phi_p$ and said feedback phase-difference modulation $\Delta\phi_{cr}$, and
- means for controlling the gain of said modulation chain allowing to keep adjusted the transfer function of said modulation chain.

According to the invention, said fiber-optic measurement device is characterized in that said biasing means are adapted to generate said biasing signal such that said phase modulator generates a biasing phase-shift modulation $\phi_b(t)$, when it is subjected to said biasing modulation voltage $V_b(t)$, said biasing phase-shift modulation $\phi_b(t)$ being the sum of:
- a first biasing phase-shift modulation component $\phi_{b1}(t)$, introducing a first biasing phase-difference modulation component $\Delta\phi_{b1}(t)$ between said two counter-propagating waves, said first biasing phase-difference modulation component $\Delta\phi_{b1}(t)$ being a square-wave periodic modulation, of levels $+\pi$ and $-\pi$, at a first biasing modulation frequency $f_{b1}$ such that $f_{b1}=(2k_1+1)f_p$, $k_1$ being a natural number and $f_p$ said proper frequency, and
- a second biasing phase-shift modulation component $\phi_{b2}(t)$, introducing a second biasing phase-difference modulation component $\Delta\phi_{b2}(t)$ between said two counter-propagating waves, said second biasing phase-difference modulation component $\Delta\phi_{b2}(t)$ being a periodic modulation, of extreme amplitudes $+\pi/a$ and $-\pi/a$, $a$ being a non-zero real number such that $|a|>1$, at a second biasing modulation frequency $f_{b2}$ such that $f_{b2}=(2k_2+1)f_p$, $k_2$ being a non-zero natural number such that $k_2>k_1$, and $f_p$ said proper frequency.

Hence, said device according to the invention allows to perform a "biasing" around $\pi$, thanks to said first biasing phase-difference modulation component $\Delta\phi_{b1}(t)$ offering an optimal signal-to-noise ratio for the detection chain. Said device also allows to increase the frequency of demodulation of the signal function of said phase difference $\Delta\phi_p$ and of said parameter to be measured thanks to said second biasing phase-difference modulation component $\Delta\phi_{b2}(t)$ to reduce the response time of the interferometer without thereby increasing the number of cumbersome peaks in the modulated electrical signal. The stability of the closed loop is hence improved, that is to say that the measurement device according to the invention is capable of measuring a parameter generating a non-reciprocal effect, even if said parameter to be measured varies very rapidly.

Moreover, other advantageous and non-limitative characteristics of the device according to the invention are as follows:
- said first biasing phase-difference modulation component $\Delta\phi_{b1}(t)$ has a duty factor of 50%;
- said second biasing phase-difference modulation component $\Delta\phi_{b2}(t)$ has a duty factor of 50%;
- the first biasing modulation frequency $f_{b1}$ of said first biasing phase-difference modulation component $\Delta\phi_{b1}(t)$ is such that $k_1=0$;
- the second biasing modulation frequency $f_{b2}$ of said second biasing phase-difference modulation component $\Delta\phi_{b2}(t)$ is such that $k_2>2$;
- the second biasing modulation frequency $f_{b2}$ of said second biasing phase-difference modulation component $\Delta\phi_{b2}(t)$ is such that $k_2>4$;
- the second biasing modulation frequency $f_{b2}$ of said second biasing phase-difference modulation component $\Delta\phi_{b2}(t)$ is a square-wave modulation;

the second biasing modulation frequency $f_{b2}$ of said second biasing phase-difference modulation component $\Delta\phi_{b2}(t)$ is a sine-wave modulation;

the second biasing modulation frequency $f_{b2}=(2k_2+1)f_p$ is such that $f_{b2}=(2k_{21}+1)f_{b1}$, $k_{21}$ being a non-zero natural number, and $f_{b1}=(2k_1+1)f_p$ being the first biasing modulation frequency, and said first biasing phase-difference modulation component $\Delta\phi_{b1}(t)$ and said second biasing phase-difference modulation component $\Delta\phi_{b2}(t)$ are in phase quadrature;

said feedback phase-shift modulation $\phi_{cr}(t)$ is a stair-step modulation;

said feedback phase-shift modulation $\phi_{cr}(t)$ and said first biasing phase-shift modulation component $\phi_{b1}(t)$ are synchronous, each stair-step of said feedback phase-shift modulation $\phi_{cr}(t)$ having a duration $\Delta\tau_g$ and said first biasing phase-shift modulation component $\phi_{b1}(t)$ being a first biasing modulation frequency $f_{b1}$ such that $f_{b1}=f_p$, $f_p$ being the proper frequency;

said feedback phase-shift modulation $\phi_{cr}(t)$ falls down by $2\pi$ when it exceeds $2\pi$;

said digital processing unit demodulates said digital electrical signal in phase with said second biasing phase-difference modulation component $\Delta\phi_{b2}(t)$ independently of the first biasing phase-difference modulation component $\Delta\phi_{b1}(t)$, and said means for controlling the gain of said modulation chain demodulate said digital electrical signal so as to provide a signal function of the transfer function of said modulation chain.

The measurement device according to the invention is particularly well adapted for the making of a gyrometer. In this case, the parameter to be measured is a component of the rotational speed of the ring interferometer.

Hence, the invention also relates to a gyrometer, characterized in that it is compliant with the fiber-optical measurement device according to the invention, the parameter to be measured being a component of the rotational speed of the ring interferometer.

This gyrometer advantageously enters into the making of navigation or inertial-stabilization systems.

Hence, the invention also proposes a navigation or inertial-stabilization system including at least one gyrometer according to the invention.

BRIEF DESCRIPTION OF THE DRAWINGS

Embodiments of the invention will be described in detail with reference to the drawings in which:

FIG. 5 shows an example according to a particular embodiment of the invention of first and second biasing phase-shift modulation components $\phi_{b1}(t)$ and $\phi_{b2}(t)$, generating the first and second biasing phase-difference modulation components $\Delta\phi_{b1}(t)$ and $\phi_{b2}(t)$ shown in FIG. 4;

FIG. 6 shows an example of phase-difference modulation $\Delta\phi_m(t)$ according to a particular embodiment of the invention, the open-loop total phase difference in the interferometer and the corresponding modulated electrical signal produced by the detector when the parameter to be measured generates a zero phase difference $\Delta\phi_p$ and when the transfer function of the modulation chain is correctly adjusted;

DETAILED DESCRIPTION OF THE INVENTION

Figure 1:
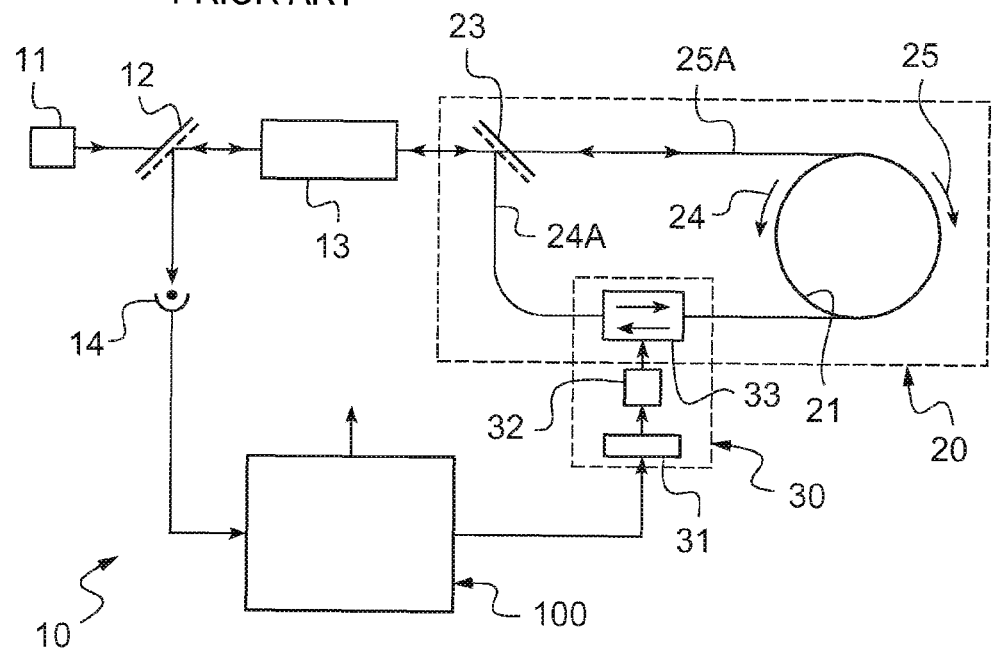
FIG. 1 shows a schematic view of the measurement device according to the prior art.

FIG. 1 shows a fiber-optic measurement device 10 according to the prior art, of type in which a parameter to be measured generates a phase difference $\Delta\phi_p$ between two waves.

The fiber-optic measurement device 10 first includes a light source 11 herein comprising a laser diode.

As a variant, the light source may comprise, for example, a super-luminescent diode or a doped-fiber light source of the "ASE" ("Amplified Spontaneous Emission") type.

The device 10 also comprises a first splitting element 12. This first splitting element 12 is herein a semi-reflective plate having a transmittance of 50% and a reflectance of 50%.

As a variant, the splitting element may, for example, be a 3-decibel 2×2 coupler or an optical circulator.

The luminous wave emitted by the light source 11 is hence transmitted in part by the first splitting element 12 towards an optical filter 13 at the output of which the luminous wave has been filtered. The optical filter 13 preferably includes a polarizer and a spatial filter. This spatial filter is herein a single-mode optical fiber, preferably of the polarization-maintaining type.

The device 10 also includes a SAGNAC ring interferometer 20 comprising a fiber-optic coil 21 wound around itself. It is herein an optical fiber, preferably of the single-mode and polarization-maintaining type.

This SAGNAC ring interferometer 20 also comprises a second splitting element 23 allowing to split the wave exiting from the optical filter 13 into two counter-propagating waves 24, 25 on the two "arms" of the ring interferometer 20, these two arms defining two optical paths 24A and 25A. The second splitting element 23 is herein a semi-reflective plate having a transmittance of 50% and a reflectance of 50%.

The second splitting element 23 also allows to recombine the two counter-propagating waves 24, 25 at the output of the ring interferometer 20.

As a variant, the second splitting element may be, for example, a 3-decibel 2×2 coupler or a "Y"-junction in integrated optics.

The two counter-propagating waves 24, 25 then pass through the optical filter 13 and are reflected by the first splitting element 12 towards an electromagnetic radiation detector 14.

This detector 14 is herein a semi-conductor photodiode.

The detector 14 is sensitive to the luminous power received, which is herein function of the interference state between the two counter-propagating waves 24, 25 during their recombination at the output of the SAGNAC ring interferometer 20. It hence delivers an electrical signal that is representative of the total phase difference $\Delta\phi_t$ between the two counter-propagating waves 24, 25. It will be seen in the following of the description that this electrical signal is a modulated electrical signal.

The device 10 also includes a modulation chain 30 comprising a digital/analog converter 31, an amplifier 32 and a phase modulator 33.

The digital/analog converter 31 processes a digital control signal delivered by the control means 140, the decomposition of this signal being described in detail hereinafter. The digital/analog converter 31 delivers as an output an analog control signal.

The amplifier 32 then processes this analog control signal to deliver a modulation control voltage $V_m(t)$ to the phase modulator 33.

The phase modulator 33 is placed in the ring interferometer 20 and is thus also a part thereof. It is herein arranged at one end of the optical path of the SAGNAC ring interferometer 20. The phase modulator 33 is herein of the electro-optical type (said of "Pockels effect" type) in proton-exchange lithium-niobate integrated optics.

The phase modulator 33 allows, when the time-dependant control modulation voltage $V_m(t)$ is applied at the input thereof, to generate a phase-shift modulation $\phi_m(t)$ that is proportional, and thus with the same time dependency, on a luminous wave passing through it at the given instant t in one direction or another.

In the case of the SAGNAC ring interferometer 20 shown in FIG. 1, the transit-time difference of the counter-propagating waves 24, 25 along the two optical paths 24A, 25A between the phase modulator 33 and the second splitting element 23 is denoted $\Delta\tau_g$.

Hence, the phase-shift modulation $\phi_m(t)$ generated by the phase modulator 33 controlled by the modulation control voltage $V_m(t)$ introduces between the two counter-propagating waves 24, 25, a phase-difference modulation $\Delta\phi_m(t)$ such that: $\Delta\phi_m(t)=\phi_m(t)-\phi_m(t-\Delta\tau_g)$.

The transit-time difference $\Delta\tau_g$ also defines a proper frequency $f_p$ of the SAGNAC ring interferometer 20 by the relation: $f_p=1/(2\Delta\tau_g)$.

This proper frequency $f_p$ thus depends on the length of the coil 21 in the SAGNAC ring interferometer 20. With the fiber-optic coil 21 used herein, a coil having a length of 1 kilometer, the proper frequency $f_p$ of the SAGNAC ring interferometer 20 is of about 100 kilohertz (kHz), corresponding to a transit-time difference $\Delta\tau_g$ of 5 microseconds (μs).

The luminous power $P(\Delta\phi_1)$ received by the detector 14 is also modulated and the electrical signal delivered by the detector 14 will thus be a modulated electrical signal (38), examples of which are given in FIGS. 6 to 9.

The modulated electrical signal 38 is transmitted to electronic means 100 that process it to deliver a signal function of the phase difference $\Delta\phi_p$ and of the parameter to be measured.

Figure 2:
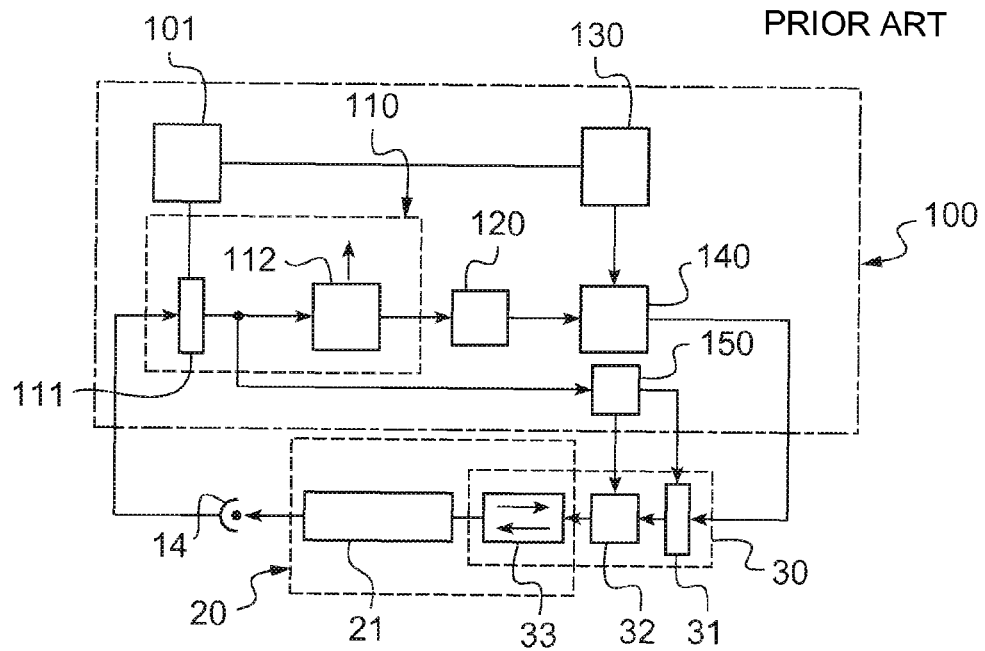
FIG. 2 shows a functional scheme representing the different means implemented in the measurement device according to the prior art.

For that purpose, the electronic means 100 comprise signal processing means 110, as shown in FIG. 2. These signal processing means 110 include an analog/digital converter 111 digitizing the modulated electrical signal 38 provided by the detector 14 to deliver a digital electrical signal.

This digitization operation is performed at a synchronization frequency fixed by the clock 101. The synchronization frequency of the clock 101 is preferably a multiple of the proper frequency $f_p$ of the SAGNAC ring interferometer 20.

The signal processing means 110 also comprise a digital processing unit 112 configured to process the digital electrical signal provided at the output of the analog/digital converter 111. The digital processing unit 112 also includes a digital demodulator, a control-loop digital filter fed with a first demodulated digital signal exiting from the digital demodulator and a register.

The digital processing unit 112 delivers a signal function of the phase difference $\Delta\phi_p$ and of the parameter to be measured for any desired external use.

The electronic means 100 also control in return the modulation chain 30.

For that purpose, the electronic means 100 include, on the one hand, feedback means 120 and, on the other hand, biasing means 130.

The feedback means 120 receive as an input the signal function of the phase difference $\Delta\phi_p$ of the parameter to be measured provided by the digital processing unit 112. The feedback means 120 generate as an output a feedback signal whose action on the modulation chain 30 will be described in more detail hereinafter.

The feedback means 120 herein include an accumulator.

The biasing means 130 are configured to generate a biasing signal at precise instants, synchronized by the frequency of the clock 101. The action of this biasing signal on the modulation chain 30 will be described in more detail hereafter.

The electronic means 100 further include control means 140 that have two inputs and one output. The control means 140 receive as an input, on the one hand, the feedback signal, and on the other hand, the biasing signal. These signals are then processed by the control means 140. The control means 140 deliver as an output a digital control signal that is then transmitted to the digital/analog converter 31 of the modulation chain 30.

The control means 140 herein include a digital adder. The operation performed by the control means 140 consists in the digital addition of the feedback signal provided by the feedback means 120 and of the biasing signal provided by the biasing means 130. The digital control signal is the signal resulting from this addition.

The digital control signal is then transmitted to the modulation chain 30. It is converted into an analog control signal by the digital/analog converter 31, then transmitted to the amplifier 32 that delivers a modulation control voltage $V_m(t)$ to the phase modulator 33.

The modulation chain 30 thus receives as a input the digital control signal and produces as an output, by means of the phase modulator 33, a phase-shift modulation $\phi_m(t)$ modulated in time, which will be introduced in the counter-propagating waves 24, 25 propagating in the SAGNAC ring interferometer 20.

The modulation chain 30 is then characterized electronically by its transfer function between the input and the output. This transfer function is the ratio between the value (in radians) of the phase-shift effectively generated by the modulation chain 30 via the phase modulator 33 and the value (with no unity) of the digital control signal transmitted to the modulation chain 30.

In order to keep the transfer function of the modulation chain 30 adjusted, the electronic means 100 also include gain control means 150.

These gain control means 150 include another digital processing unit (not shown) using the digital electrical signal delivered by the analog/digital converter 111 so as to provide a signal function of the transfer function of the modulation chain 30.

This signal is filtered by a control-loop digital integrating filter that feeds another digital/analog converter controlling the variable gain G of the amplifier 32 or the analog reference voltage of the digital/analog converter 31. Hence, the transfer function of the modulation chain 30 is kept correctly adjusted, as well as the modulation control voltage $V_m(t)$ delivered by the amplifier 32 to the phase modulator 33.

It is meant by this that a given value of the digital control signal at the input of the modulation chain 30 will always give the same value (in radians) of phase-shift modulation $\phi_m$ generated by the phase modulator 33, and hence the same value (in radians) of the phase-difference modulation $\Delta\phi_m$ introduced between the two counter-propagating waves 24, 25 in the SAGNAC ring interferometer 20.

The digital control signal being the sum of the feedback signal and the biasing signal, the modulation control voltage $V_m(t)$ at the input of the phase modulator 33 is decomposed into the sum of a feedback modulation voltage $V_{cr}(t)$ and a biasing modulation voltage $V_b(t)$.

The feedback modulation voltage $V_{cr}(t)$ at the input of the phase modulator 33 results, at the output of the phase modulator 33, in a feedback phase-shift modulation $\phi_{cr}(t)$ on the wave passing through it.

In the case of the SAGNAC ring interferometer 20, the effect of this feedback phase-shift modulation $\phi_{cr}(t)$ is the introduction of a feedback phase-difference modulation $\Delta\phi_{cr}(t)$ between the two counter-propagating waves 24, 25, allowing to compensate for the phase difference $\Delta\phi_p$ generated by the parameter to be measured and hence to keep at zero the sum of the phase difference $\Delta\phi_p$ and the phase difference $\Delta\phi_{cr}$.

This feedback allows to make the device 10 operate in closed loop so as to reach a good linearity and stability of the measurement of the parameter generating the phase difference $\Delta\phi_p$.

Figure 3:
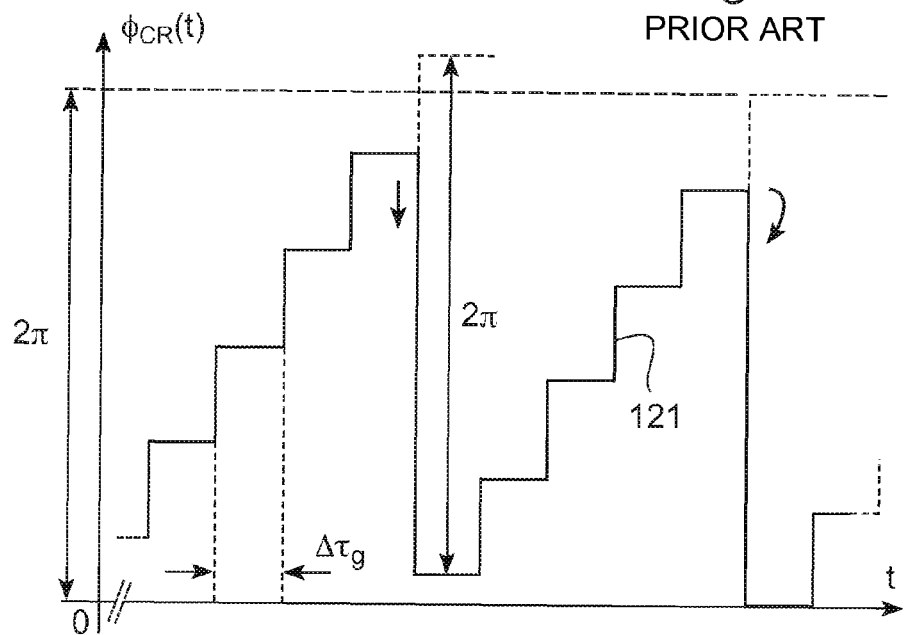
FIG. 3 shows an example according to the prior art of a stair-step feedback phase-shift modulation $\phi_{cr}(t)$ falling down by $2\pi$ when it exceeds $2\pi$.

According to the prior art, FIG. 3 relates to the feedback phase-shift modulation $\phi_{cr}(t)$ generated by the phase modulator 33 from the feedback modulation voltage $V_{cr}(t)$.

The feedback signal generated by the feedback means 120 is a stair-step digital signal.

For a SAGNAC ring interferometer 20, of proper frequency $f_p$, the prior art teaches a duration of $\Delta\tau_g$ for each step, the passage from one step to another being synchronized thanks to the clock 101 present in the electronic means 100.

This is translated in FIG. 3 at the level of the feedback phase-shift modulation $\phi_{cr}(t)$ that is a stair-step modulation. As mentioned hereinabove, the prior art teaches that the duration of the steps of the feedback phase-shift modulation $\phi_{cr}(t)$ is equal to $\Delta\tau_g$.

Likewise, as described hereinabove, the height of the step is such that the phase-difference modulation $\Delta\phi_{cr}(t)$ introduced between the two counter-propagating waves 24, 25 compensate for the phase difference $\Delta\phi_p$ due to the parameter measured.

Moreover, the feedback phase-shift modulation $\phi_{cr}(t)$ is a stair-step ramp modulation such that this modulation falls down by $2\pi$, as shown in FIG. 3, when the value of the step exceeds $2\pi$.

It is known that this "falling down to $2\pi$" is made necessary by the fact that the value of the feedback modulation voltage $V_{cr}(t)$ cannot increase indefinitely. The use of digital means, such as the digital/analog converter 31, allows to make simply this falling down to $2\pi$.

As mentioned above, the biasing means 130 are configured to generate a biasing signal, this biasing signal being transmitted to the control means 140 piloting the modulation chain 30.

This biasing signal is associated with the biasing modulation voltage $V_b(t)$, through the digital/analog converter 31 and the amplifier 32.

This biasing modulation voltage $V_b(t)$ at the output of the amplifier 32 and at the input of the phase modulator 33 results at the output of the phase modulator 33 in a biasing phase-shift modulation $\phi_b(t)$ on a wave passing through it.

In the case of the SAGNAC ring interferometer 20, the effect of this biasing phase-shift modulation $\phi_b(t)$ is the introduction of a biasing phase-difference modulation $\Delta\phi_b(t)$ between the two counter-propagating waves 24, 25.

The modulation control voltage $V_m(t)$ at the input of the phase modulator 33 being decomposed into the sum of the feedback modulation voltage $V_{cr}(t)$ and the biasing modulation voltage $V_b(t)$, the phase-shift modulation $\phi_m(t)$ (respectively the phase-difference modulation $\Delta\phi_m(t)$) is the sum of the feedback phase-shift modulation $\phi_{cr}(t)$ (respectively the feedback phase-difference modulation $\Delta\phi_{cr}(t)$) and the biasing phase-shift modulation $\phi_b(t)$ (respectively the biasing phase-difference modulation $\Delta\phi_b(t)$), such that: $\phi_m(t)=\phi_{cr}(t)+\phi_b(t)$, and $\Delta\phi_m(t)=\Delta\phi_{cr}(t)+\Delta\phi_b(t)$.

According to the invention, the biasing phase-shift modulation $\phi_b(t)$ is the sum of:

a first biasing phase-shift modulation component $\phi_{b1}(t)$, and a second biasing phase-shift modulation component $\phi_{b2}(t)$.

For that purpose, the biasing means 130 are arranged so that the biasing digital signal is the sum of a first biasing component and a second biasing component.

The first biasing component is associated with a first voltage component $V_{b1}(t)$, through the digital/analog converter 31 and the amplifier 32.

Likewise, the second biasing component is associated with a second voltage component $V_{b2}(t)$, through the digital/analog converter 31 and the amplifier 32.

Therefore, the biasing modulation voltage $V_b(t)$ is decomposed into the sum of a first voltage component $V_{b1}(t)$ and a second voltage component $V_{b2}(t)$, generated through the amplifier 32 and the digital/analog converter 31, respectively from the first biasing component and the second biasing component.

According to the invention, the first biasing phase-shift modulation component $\phi_{b1}(t)$ 35A, generated from the first voltage component $V_{b1}(t)$ thanks to the phase modulator 33, introduces a first biasing phase-difference modulation component $\Delta\phi_{b1}(t)$ between the counter-propagating waves 24, 25 of the SAGNAC ring interferometer 20.

According to the invention, this first biasing phase-difference modulation component $\Delta\phi_{b1}(t)$ is a square-wave periodic modulation at a first biasing modulation frequency $f_{b1}$ such that $f_{b1}=(2k_1+1)f_p$, $k_1$ being a natural number and $f_p$ the proper frequency.

According to a preferred embodiment of the invention, the first biasing modulation frequency $f_{b1}$ is herein equal to the proper frequency $f_p$ ($k_1=0$) of the SAGNAC ring interferometer 20.

As a variant, the first biasing modulation frequency $f_{b1}$ may be, for example, an odd multiple of the proper frequency $f_p$, such that $k_1>0$.

Figure 4:
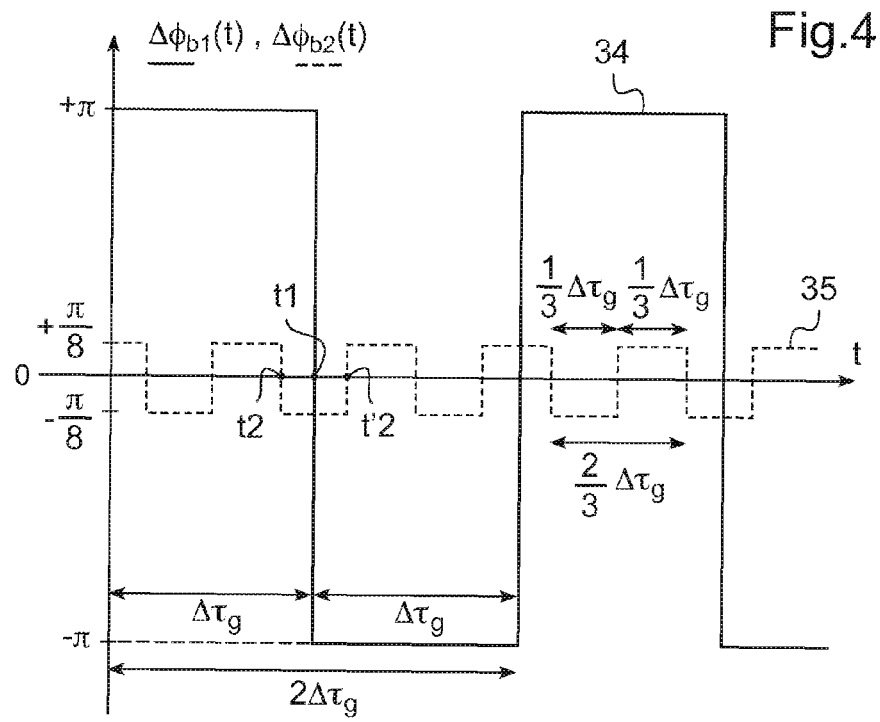
FIG. 4 shows an example according to a particular embodiment of the invention of first and second biasing phase-difference modulation components $\Delta\phi_{b1}(t)$ and $\Delta\phi_{b2}(t)$.

An example of this first biasing phase-difference modulation component $\Delta\phi_{b1}(t)$ is shown and denoted by 34 in FIG. 4.

According to the invention, the first biasing phase-difference modulation component $\Delta\phi_{b1}(t)$ 34 has extreme levels of values $+\pi$ and $-\pi$. This first modulation component will hence be referred to hereinafter "$\pi$-modulation".

In a preferred embodiment of the invention, this $\pi$-modulation, denoted by 34, has herein a duty factor of 50%, i.e. the duration of the level $+\pi$ (respectively the level $-\pi$) represents 50% (respectively 50%) of the total duration of the period of $\pi$-modulation, denoted by 34.

The first biasing modulation frequency $f_{b1}$ being herein equal to the proper frequency $f_p=1/(2\Delta\tau_g)$ of the SAGNAC ring interferometer 20, the period of the $\pi$-modulation, denoted by 34, is equal to $1/f_{b1}=2\Delta\tau_g$, the $\pi$-modulation, denoted by 34, remaining at its level $+\pi$ during a half-period of duration $\Delta\tau_g$, and at its level $-\pi$ during another half-period of duration $\Delta\tau_g$.

The first voltage component $V_{b1}(t)$ produces a first biasing phase-shift modulation component $\phi_{b1}(t)$ 34A as shown in FIG. 5. The phase modulator 33 is a reciprocal modulator, the SAGNAC ring interferometer 20 behaves as a delay line between the two counter-propagating waves 24, 25, such that the first biasing phase-difference modulation component $\Delta\phi_{b1}(t)$ 34 verifies the relation: $\Delta\phi_{b1}(t)=\phi_{b1}(t)-\phi_{b1}(t-\Delta\tau_g)$.

Therefore, it is understood how the first biasing phase-difference modulation component $\Delta\phi_{b1}(t)$ 34, shown in FIG. 4, is generated from the first biasing phase-shift modulation component $\phi_{b1}(t)$ 34A, shown in FIG. 5.

In a particular embodiment of the invention, where each stair step of the feedback phase-shift modulation $\phi_{cr}(t)$ has a duration $\Delta\tau_g$, the feedback phase-shift modulation $\phi_{cr}(t)$ created through the modulation chain 30 is synchronous with the first biasing phase-shift modulation component $\phi_{b1}(t)$ which is herein at the proper frequency $f_p$.

It will be defined herein that the feedback phase-shift modulation $\phi_{cr}(t)$ and the first biasing phase-shift modulation component $\phi_{b1}(t)$ are in phase with each other when the passage of the feedback phase-shift modulation $\phi_{cr}(t)$ from one step to another occurs during a transition of the first biasing phase-shift modulation component $\phi_{b1}(t)$ from one extreme level to another.

According to this particular embodiment, the falling down to $2\pi$ of the feedback phase-shift modulation $\phi_{cr}(t)$ is then synchronized with a transition of the $\pi$-modulation, denoted by 34.

According to the invention, the second biasing phase-shift modulation component $\phi_{b2}(t)$, generated from the second voltage component $V_{b2}(t)$ thanks to the phase modulator 33, introduces a second biasing phase-difference modulation component $\phi_{b2}(t)$ between the counter-propagating waves 24, 25 of the SAGNAC ring interferometer 20.

According to the invention, this second biasing phase-difference modulation component $\phi_{b2}(t)$ is a periodic modulation at a second biasing modulation frequency $f_{b2}$, such that $f_{b2}=(2k_2+1)f_p$, $k_2$ being a non-zero natural number such that $k_2>k_1$ and $f_p$ being the proper frequency.

The second biasing modulation frequency $f_{b2}$ is hence a frequency strictly higher than the first biasing modulation frequency $f_{b1}$.

According to a particular embodiment of the invention, the second biasing modulation frequency $f_{b2}$ is such that $f_{b2}=3f_p$ (i.e. $k_2=1$). It is hence effectively strictly higher than the first biasing modulation frequency $f_{b1}$, which is herein such that $f_{b1}=f_p$.

In another embodiment, the second biasing modulation frequency $f_{b2}$ is preferentially such that $k_2>2$, and still more preferentially such that $k_2>4$.

According to a particular embodiment of the invention, the second biasing phase-difference modulation component $\Delta\phi_{b2}(t)$ is herein a square-wave modulation.

An example of this second biasing phase-difference modulation component $\Delta\phi_{b2}(t)$ is shown and denoted by 35 in FIG. 4. It can be observed that the second biasing phase-difference modulation component $\Delta\phi_{b2}(t)$ 35 has, in this example, extreme levels of values $+\pi/8$ and $-\pi/8$. The second modulation component of this example will hence be referred to hereinafter "$\pi/8$-modulation".

Generally, the second biasing phase-difference modulation component $\Delta\phi_{b2}(t)$ may have extreme levels of values $+\pi/a$ and $-\pi/a$, a being a real number verifying the condition $|a|>1$. The second modulation component is then generally referred to as "$\pi/8$-modulation".

As shown in FIG. 4, the $\pi/8$-modulation, denoted by 35, has preferably a duty factor of 50%, i.e. the duration of the level $+\pi/8$ (respectively the level $-\pi/8$) represents 50% (respectively 50%) of the total duration of the period of modulation $\pi/8$, denoted by 35.

The second biasing modulation frequency $f_{b2}$ being herein equal to $3f_p=3/(2\Delta\tau_g)$ of the SAGNAC ring interferometer 20, the period of $\pi/8$-modulation, denoted by 35, is equal to $1/f_{b2}=(2/3)\Delta\tau_g$, the $\pi/8$-modulation, denoted by 35, remaining at its level $+\pi/8$ during a half-period of duration $(1/3)\Delta\tau_g$, and at its level $-\pi/8$ during another half-period of duration $(1/3)\Delta\tau_g$.

According to another embodiment of the invention, the second biasing phase-difference modulation component $\Delta\phi_{b2}(t)$ is a sine-wave periodic modulation, of amplitude $\pi/a$, such that a is a non-zero real number verifying the condition $|a|>1$.

The second biasing modulation voltage $V_{b2}(t)$ produces a second biasing phase-shift modulation component $\phi_{b2}(t)$ 35A as shown in FIG. 5. By analogy with the first modulation component described hereinabove, the second biasing phase-difference modulation component $\Delta\phi_{b2}(t)$ 35 verifies the relation: $\Delta\phi_{b2}(t)=\phi_{b2}(t)-\phi_{b2}(t-\Delta\tau_g)$.

Therefore, it is understood how is generated the second biasing phase-difference modulation component $\Delta\phi_{b2}(t)$ 35, shown in FIG. 4, from the second biasing phase-shift modulation component $\phi_{b2}(t)$ 35A, shown in FIG. 5.

According to the particular embodiment described hereinabove, the second biasing modulation frequency $f_{b2}$ is an odd multiple of the first biasing modulation frequency $f_{b1}$. Indeed, the first biasing modulation frequency $f_{b1}$ being such that $f_{b1}=f_p$, the second biasing modulation frequency $f_{b2}$ is such that $f_{b2}=3f_p=3f_{b1}=(2k_{21}+1)f_{b1}$, with $k_{21}=1$.

Moreover, the first biasing phase-difference modulation component $\Delta\phi_{b1}(t)$ 34 and the second biasing phase-difference modulation component $\Delta\phi_{b2}(t)$ 35 are herein in phase quadrature.

It will be defined herein that the first biasing phase-difference modulation component $\Delta\phi_{b1}(t)$ 34 and the second biasing phase-difference modulation component $\Delta\phi_{b2}(t)$ 35 are in phase quadrature when a transition of the first biasing phase-difference modulation component $\Delta\phi_{b1}(t)$ 34 from one extreme level to another one occurs at equal distance from two successive zeroes of the second biasing phase-difference modulation component $\Delta\phi_{b2}(t)$ 35.

As illustrated in FIG. 4, the modulation $\pi$, denoted by 34, operates a transition from the level $+\pi$ to the level $-\pi$ at the instant $t=t1$. Likewise, the $\pi/8$-modulation, denoted by 35, is cancelled at two instants $t2$ and $t'2$ about the considered transition of the modulation $\pi$, denoted by 34. The modulation π, denoted by 34, and the π/8-modulation, denoted by 35, are in phase quadrature because herein |t1−t2|=t1−t'2|.

Figure 7:
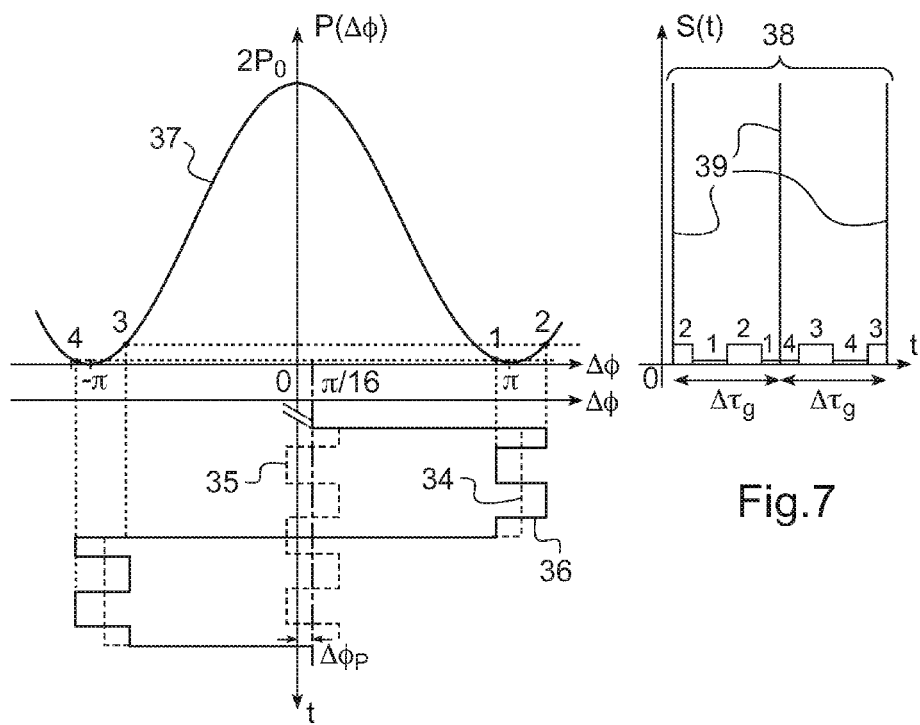
FIG. 7 shows an example of phase-difference modulation $\Delta\phi_m(t)$ according to a particular embodiment of the invention, the open-loop total phase difference in the interferometer and the corresponding modulated electrical signal produced by the detector when the parameter to be measured generates a non-zero phase difference $\Delta\phi_p$ and when the transfer function of the modulation chain is correctly adjusted.
Figure 8:
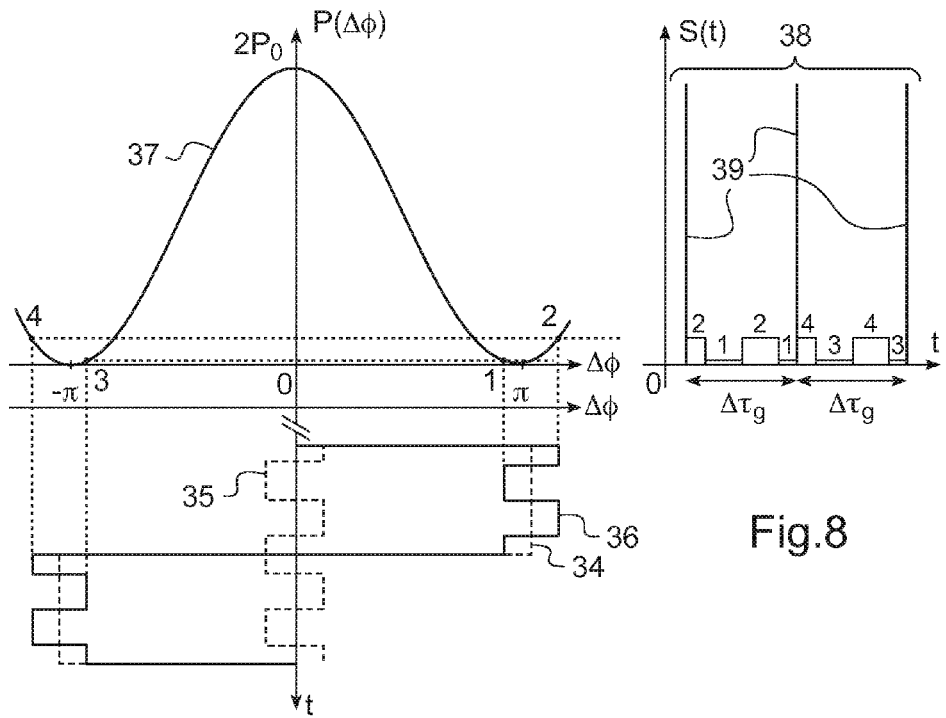
FIG. 8 shows an example of phase-difference modulation $\Delta\phi_m(t)$ according to a particular embodiment of the invention, the open-loop total phase difference in the interferometer and the corresponding modulated electrical signal produced by the detector when the parameter to be measured generates a zero phase difference $\Delta\phi_p$ and when the transfer function of the modulation chain is incorrectly adjusted.
Figure 9:
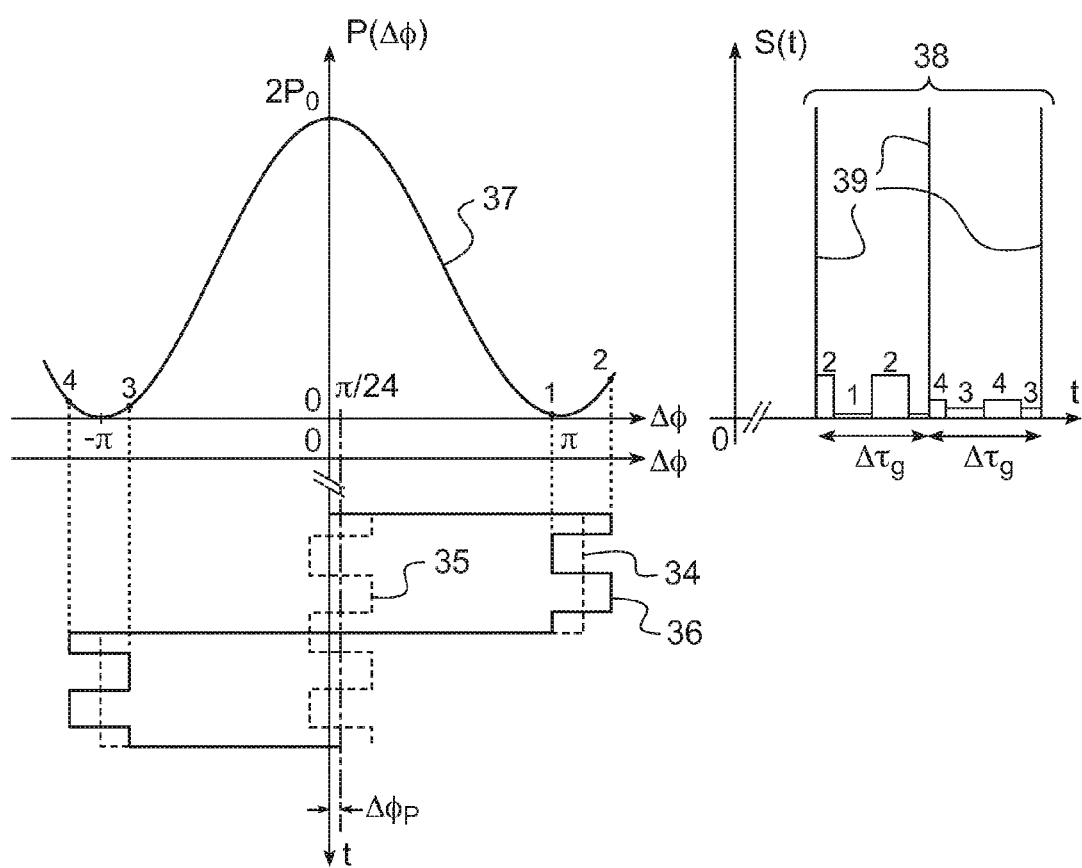
FIG. 9 shows an example of phase-difference modulation $\Delta\phi_m(t)$ according to a particular embodiment of the invention, the open-loop total phase difference in the interferometer and the corresponding modulated electrical signal produced by the detector when the parameter to be measured generates a non-zero phase difference $\Delta\phi_p$ and when the transfer function of the modulation chain is incorrectly adjusted.

In FIGS. 6 to 9, different operations of a particular embodiment of the device according to the invention are shown:

in FIG. 6, the phase difference $\Delta\phi_p$ generated by the parameter to be measured is zero and the transfer function of the modulation chain 30 is correctly adjusted, in FIG. 7, the phase difference $\Delta\phi_p$ generated by the parameter to be measured is non-zero and the transfer function of the modulation chain 30 is correctly adjusted, in FIG. 8, the phase difference $\Delta\phi_p$ generated by the parameter to be measured is zero and the transfer function of the modulation chain 30 is incorrectly adjusted, and in FIG. 9, the phase difference $\Delta\phi_p$ generated by the parameter to be measured is non-zero and the transfer function of the modulation chain 30 is incorrectly adjusted.

In each of the FIGS. 6 to 9, where $\Delta\phi = \Delta\phi_b + \Delta\phi_p$ represents the open-loop phase difference at the output of the ring interferometer 20 and t represents the time, it has been shown:

the biasing phase-difference modulation $\Delta\phi_b(t)$ 36, which is the sum of the first biasing phase-difference modulation component $\Delta\phi_{b1}(t)$ 34 and the second biasing phase-difference modulation component $\Delta\phi_{b2}(t)$ 35, the luminous power $P(\Delta\phi)$ 37 received by the detector 14, and the modulated electrical signal S(t) 38 delivered by the detector 14.

For more simplicity, the reasoning is made for these FIGS. 6 to 9 on a device 10 placed in open loop. In this case, the luminous power $P(\Delta\phi)$ 37 received by the detector 14 is a cosine-wave function of the relative phase difference $\Delta\phi$ between the two counter-propagating waves 24, 25 in the SAGNAC ring interferometer 20.

The luminous power $P(\Delta\phi)$ 37 received by the detector 14 is indeed of the form: $P(\Delta\phi) = P_0[1+\cos(\Delta\phi)]$. It is hence zero when $\Delta\phi = +\pi$ or $-\pi$, (because $\cos(+\pi) = \cos(-\pi) = -1$) and it is maximum and equal to $2P_0$ when $\Delta\phi = 0$ (because $\cos(0) = 1$).

The reasoning may be transposed to the case of the closed loop.

The first biasing phase-difference modulation component $\Delta\phi_{b1}(t)$ 34 (modulation π) being herein at the frequency $f_p$ and the second biasing phase-difference modulation component $\Delta\phi_{b2}(t)$ 35 (π/8-modulation) being at the frequency $3f_p$, the biasing phase-difference modulation $\Delta\phi_b(t)$ 36, which is the sum of the two previous modulations, is hence a periodic modulation at the proper frequency $f_p$.

As described hereinabove, the modulation π, denoted by 34, has two extreme levels +π and −π and the π/8-modulation, denoted by 35, has two extreme levels +π/8 and −π/8, so that the biasing phase-difference modulation $\Delta\phi_b(t)$ has sequentially four different levels defining four different modulation states, which are:

State E1 or state "<+−>": when the modulation π, denoted by 34, is at its "high" extreme level +π and when the π/8-modulation, denoted by 35, is at its "low" extreme level −π/8, State E2 or state "<++>": when the modulation π, denoted by 34, is at its "high" extreme level +π and when the π/8-modulation, denoted by 35, is at its "high" extreme level +π/8, State E3 or state "<−+>": when the modulation π, denoted by 34, is at its "low" extreme level −π and when the π/8-modulation, denoted by 35, is at its "high" extreme level +π/8, State E4 or state "<−−>": when the modulation π, denoted by 34, is at its "low" extreme level −π and when the π/8-modulation, denoted by 35, is at its "low" extreme level −π/8, These four distinct modulation states E1, E2, E3, E4 are preferably close to a dark fringe of the SAGNAC ring interferometer 20, where the signal-to-noise ratio is optimum.

The luminous power $P(\Delta\phi)$ 37 received by the detector 14 is hence modulated according to these four distinct modulation states and the modulated electrical signal S(t) 38 delivered by the detector 14 takes sequentially four values S1, S2, S3 and S4 respectively associated with the four modulation states E1, E2, E3 and E4.

When the parameter to be measured generates a zero phase difference $\Delta\phi_p$, as it is the case in FIG. 6, then the four levels of the biasing phase-difference modulation $\Delta\phi_b(t)$ 36 are:

For the state E1 (state <+−>):

$$\Delta\phi = \Delta\phi_b + \Delta\phi_p = \Delta\phi_b = \Delta\phi_{b1} + \Delta\phi_{b2} = +\pi - \pi/8 = 8\pi/8$$

For the state E2 (state <++>):

$$\Delta\phi = \Delta\phi_b + \Delta\phi_p = \Delta\phi_b = \Delta\phi_{b1} + \Delta\phi_{b2} = +\pi + \pi/8 = 9\pi/8$$

For the state E3 (state <−+>):

$$\Delta\phi = \Delta\phi_b + \Delta\phi_p = \Delta\phi_b = \Delta\phi_{b1} + \Delta\phi_{b2} = -\pi + \pi/8 = -7\pi/8$$

For the state E4 (state <−−>):

$$\Delta\phi = \Delta\phi_b + \Delta\phi_p = \Delta\phi_b = \Delta\phi_{b1} + \Delta\phi_{b2} = -\pi - \pi/8 = -9\pi/8$$

The luminous power $P(\Delta\phi)$ 37 received by the detector 14 being a cosine-wave function, as explained above, it is herein, in the case of FIG. 6, the same whatever the modulation state. The detector 14 hence delivers a modulated electrical signal S(t) 38 taking four identical values S1, S2, S3 and S4.

From the preceding situation, described in FIG. 6, where the parameter to be measured generates a zero phase-difference $\Delta\phi_p$, the situation passes to that described in FIG. 7, where the parameter to be measured generates a non-zero phase difference $\Delta\phi_p$ between the two counter-propagating waves 24, 25 in the SAGNAC ring interferometer 20. It will be considered, in the example of FIG. 7, that the phase difference $\Delta\phi_p$ generated by the parameter to be measured is of π/16.

This may be shown in FIG. 7 by "offsetting" the biasing phase-difference modulation $\Delta\phi_b(t)$ 36 by the value $\Delta\phi_p$. This offset generates a change of the four modulation states on which is modulated the signal received by the detector 14, which is function of the luminous power $P(\Delta\phi)$ 37 received, depending on the total phase difference $\Delta\phi$ at the output of the ring interferometer 20. The four levels of the biasing phase-difference modulation $\Delta\phi_b(t)$ 36 associated with the four modulation states are hence now:

For the state E1 (state <+−>):

$$\Delta\phi = \Delta\phi_b + \Delta\phi_p = [+\pi - \pi/8] + \pi/16 = 15\pi/16$$

For the state E2 (state <++>):

$$\Delta\phi = \Delta\phi_b + \Delta\phi_p = [+\pi + \pi/8] + \pi/16 = 19\pi/16$$

For the state E3 (state <−+>):

$$\Delta\phi = \Delta\phi_b + \Delta\phi_p = [-\pi + \pi/8] + \pi/16 = -13\pi/16$$

For the state E4 (state <−−>):

$$\Delta\phi = \Delta\phi_b + \Delta\phi_p = [-\pi - \pi/8] + \pi/16 = -17\pi/16$$

Hence, as can be seen in FIG. 7, the luminous power $P(\Delta\phi)$ 37 received by the detector 14 in the modulation states E1 and E4 is lower and that received in the modulation state E2 and E3 is higher.

The detector 14 then delivers a modulated electrical signal S(t) 38 as shown in FIG. 7. This modulated electrical signal S(t) 38 takes sequentially the four values S1, S2, S3 and S4 respectively associated with the four states of modulation E1, E2, E3 and E4. These four values S1, S2, S3 and S4 taken by the modulated electrical signal S(t) 38 are herein identical two-by-two: S1=S4 and S2=S3.

It is also observed in FIG. 7 that the modulated electrical signal S(t) 38 has peaks 39 corresponding alternately to the transitions from the state E1 to the state E4 of modulation and from the state E3 to the state E2 of modulation, when the luminous power $P(\Delta\phi)$ received passes by a maximum at the value $\Delta\phi=0$.

These peaks 39 are cumbersome insofar as they introduce non wanted defects in the modulated electrical signal S(t) 38.

This modulated electrical signal S(t) 38 is then digitized by the analog/digital converter 111 that delivers and transmits a digital electrical signal to the digital processing unit 112.

This digital electrical signal is also modulated and takes four digital values Σ1, Σ2, Σ3 and Σ4 according to the four modulation states E1, E2, E3 and E4 of the biasing phase-difference modulation $\Delta\phi_b(t)$ 36 with which the values are associated.

The digital processing unit 112 demodulates the digital electrical signal in phase with the second biasing phase-difference modulation component $\Delta\phi_{b2}(t)$ 35 independently of the first biasing phase-difference modulation component $\Delta\phi_{b1}(t)$ 34.

It is meant by this that the digital processing unit 112 delivers a first demodulated digital signal $\Sigma_p$ based on the four digital values Σ1, Σ2, Σ3 and Σ4 respectively associated with the four modulation states E1, E2, E3 and E4, by performing a calculation operation of the type: $\Sigma_p=-\Sigma1+\Sigma2+\Sigma3-\Sigma4$ where the "weight" of each digital value in the preceding expression depends on the extreme level of the π/8-modulation, denoted by 35, in the modulation state associated with this digital value, but does not depend on the level of the modulation π, denoted by 34, in this modulation state.

The digital processing unit 112 hence produces a first demodulated digital signal $\Sigma_p$ depending of the phase-shift $\Delta\phi_p$ and representative of the value of the parameter to be measured in the SAGNAC ring interferometer 20.

It is herein observed that the first demodulated digital signal $\Sigma_p$ is a signal at the same frequency that the π/8-modulation, denoted by 35, i.e. $3f_p$. Nevertheless, it is also observed that the defect-bearing peaks 39 in the modulated electrical signal S(t) 38 transmitted by the detector 14 occur at the frequency equal to the double of the frequency of the modulation π, denoted by 34, i.e. herein at the frequency $2f_p$.

Hence, it is herein possible, by using a first biasing phase-difference modulation component $\Delta\phi_{b1}(t)$ 34 at the frequency $f_p$ and a second biasing phase-difference modulation component $\Delta\phi_{b2}(t)$ 35 at the frequency $3f_p$, to obtain a signal representative of the parameter to be measured at a frequency $3f_p$ and to limit the number of defect-bearing peaks 39 in the modulated electrical signal S(t) 38 delivered by the detector 14. The device 10 may then detect the rapid variations of the parameter to be measured, without thereby degrading the accuracy of the measurement.

Generally, according to the invention, the number of defect-bearing peaks 39 is function of the first biasing modulation frequency $f_{b1}$ of the first biasing phase-difference modulation component $\Delta\phi_{b1}(t)$ 34 and the frequency of the signal function of the parameter to be measured provided by the digital processing unit 112 is equal to the second biasing modulation frequency $f_{b2}$ of the second biasing phase-difference modulation component $\Delta\phi_{b2}(t)$ 35. Hence, the response time of the fiber-optic measurement device 10 according to the invention is substantially reduced and the accuracy of the measurement is maintained.

In a closed-loop operation, the first demodulated digital signal $\Sigma_p$ serves as an error signal to control the total phase difference $\Delta\phi_t$ to zero by compensating the non-reciprocal phase-shift $\Delta\phi_p$ with the opposite phase-shift $\Delta\phi_{cr}$ introduced by the phase modulator 33 controlled by the feedback means 120.

This phase-shift $\Delta\phi_{cr}$ being generated through the same modulation chain 30 as the biasing phase-difference modulation $\Delta\phi_b$, the control of the modulation chain 30, whose operation is described in detail hereinafter, thus allows to have a stable and controlled measurement of $\Delta\phi_{cr}$, and hence finally of $\Delta\phi_p$, which is opposite thereto and which is the parameter that is desired to be measured.

FIG. 8 shows the case of a fiber-optic measurement device 10 according to a particular embodiment of the invention, wherein the measured parameter generates a zero phase difference $\Delta\phi_p$, and wherein the transfer function of the modulation chain 30 is incorrectly adjusted. As above, the reasoning is herein made in open loop.

In practice, the transfer function, which depends on the characteristics of both the digital/analog converter 31 via its analog reference voltage and the amplifier 32 via its variable gain G, may undergo variations as a function of the measurement conditions, for example the temperature of operation of the device 10 of the electrical drift of certain electronic components included in the electronic means 100. Generally, the parameters influencing the transfer function generate low and slow variations of the latter, so that the gain control means 150 operate easily and rapidly so as to keep adjusted the transfer function of the modulation chain 30.

In the case shown in FIG. 8, the first biasing phase-difference modulation component $\Delta\phi_{b1}(t)$ 34 is a square-wave periodic modulation, of extreme levels $(1+\epsilon)\cdot[\pi]=16\pi/15$ and $(1+\epsilon)\cdot[-\pi]=-16\pi/15$, the parameter ε being a quantity representative of the deviation with respect to the transfer function of the correctly-adjusted modulation chain 30. Herein, the transfer function of the modulation chain 30 is such that the parameter ε is 1/15.

On the other hand, the first biasing modulation frequency $f_{b1}$ of the first biasing phase-difference modulation component $\Delta\phi_{b1}(t)$ 34 remains unchanged and herein equal to the proper frequency $f_p$.

Likewise, as shown in FIG. 8, the second biasing phase-difference modulation component $\Delta\phi_{b2}(t)$ 35 is herein a square-wave modulation, of extreme levels $(1+\epsilon)\cdot[\pi/8]=2\pi/15$ and $(1+\epsilon)\cdot[-\pi/8]=-2\pi/15$, that is periodic at a second biasing modulation frequency $f_{b2}$ remaining unchanged and equal to $3f_p$.

These changes of extreme levels of modulation has for consequence that the biasing phase-difference modulation $\Delta\phi_b(t)$ 36 is also modified by the multiplicative factor $(1+\epsilon)=16/15$.

Hence, this homothetic transformation on the four modulation levels causes a change of the four modulation states E1, E2, E3 and E4 on which is modulated the signal received by the detector 14, which is function of the luminous power $P(\Delta\phi)$ 37 received depending on the open-loop phase difference $\Delta\phi$ the output of the SAGNAC ring interferometer 20.

The four levels of the biasing phase-difference modulation $\Delta\phi_b(t)$ 36 associated to the four modulation states are hence now:

For the state E1 (state <+−>):

$$\Delta\phi=\Delta\phi_b+\Delta\phi_p=(1+\epsilon)[\pi-\pi/8]=14\pi/15$$

For the state E2 (state <++>):

$$\Delta\phi=\Delta\phi_b+\Delta\phi_p=(1+\epsilon)[\pi+\pi/8]=18\pi/15$$

For the state E3 (state <−+>):

$$\Delta\phi=\Delta\phi_b+\Delta\phi_p=(1+\epsilon)[-\pi+\pi/8]=-14\pi/15$$

For the state E4 (state <−−>):

$$\Delta\phi=\Delta\phi_b+\Delta\phi_p=(1+\epsilon)[-\pi-\pi/8]=-18\pi/15$$

Hence, the luminous power P(Δϕ) 37 received by the detector 14 in the modulation states E1 and E4 is identical, but lower than the luminous power received when the transfer function of the modulation chain 30 is correctly adjusted, as in FIGS. 7 and 8.

Likewise, the luminous power P(Δϕ) 37 received by the detector 14 in the modulation states E2 and E3 is identical, but higher than the luminous power received when the transfer function of the modulation chain 30 is correctly adjusted, as in FIGS. 7 and 8.

The detector 14 then delivers a modulated electrical signal S(t) 38 as shown in FIG. 8. This modulated electrical signal S(t) 38 takes sequentially four values S1, S2, S3 and S4 respectively associated with the four modulation states E1, E2, E3 and E4. These four values are herein identical two-by-two: S1=S3 and S2=S4.

The four values Σ1, Σ2, Σ3 and Σ4 of the digital electrical signal respectively associated with the four modulation states E1, E2, E3 and E4 being also identical two-by-two with Σ1=Σ3 and Σ2=Σ4, the first demodulated digital signal $\Sigma_p$, calculated according to the operation $\Sigma_p$=−Σ1+Σ2+Σ3−Σ4, is zero, which indicates that the value of the phase difference $\Delta\phi_p$ due to the parameter to be measured is also zero.

Moreover, the digital electrical signal delivered by the analog/digital converter 111 is transmitted to the gain control means 150 as shown in FIG. 2.

The gain control means 150 demodulate the digital electrical signal so as to provide a signal function of the transfer function of the modulation chain 30.

More precisely, the other digital processing unit of the gain control means 150 performs a calculation operation of the type: $\Sigma_G$=Σ1−Σ2+Σ3−Σ4, so as to produce a second demodulated digital signal $\Sigma_G$ independent of the phase difference $\Delta\phi_p$ generated by the parameter to be measured but significant of the transfer function of the modulation chain 30.

In particular, in the case shown in FIG. 8, the second demodulated digital signal $\Sigma_G$ is non-zero, the transfer function of the modulation chain 30 being incorrectly adjusted.

The second demodulated digital signal $\Sigma_G$ then serves as an error signal for a control loop of the transfer function of the modulation chain 30.

For that purpose, the second demodulated digital signal $\Sigma_G$ is filtered by a control-loop digital integrating filter that then feeds the digital/analog converter 31 to control the analog reference voltage or the amplifier 32 to control the variable gain G thereof.

Hence, the transfer function of the modulation chain 30 is kept correctly adjusted between the value of the digital control signal and the value of the phase-shift modulation effectively applied by the phase modulator 33.

It will be observed that, in the case of FIGS. 6 and 7, the second demodulated digital signal $\Sigma_G$ is zero because the transfer function of the modulation chain 30 is correctly adjusted.

Indeed, in this case:

Σ1=Σ4, the luminous power P(Δϕ) 37 received in the state E1 and in the state E4 being the same, and Σ2=Σ3, the luminous power P(Δϕ) 37 received in the state E2 and in the state E3 being the same.

FIG. 9 shows the case of a fiber-optic measurement device 10 according to a particular embodiment of the invention, wherein the measured parameter generates a non-zero phase difference $\Delta\phi_p$, herein equal to π/24 and wherein the transfer function of the modulation chain 30 is incorrectly adjusted. As above, the reasoning is herein made in open loop.

In the particular case of FIG. 9, the transfer function of the modulation chain 30 is herein also such that ϵ=1/15.

Hence, the four levels of the biasing phase-difference modulation $\Delta\phi_b$(t) 36 associated with the four modulation states are hence herein:

For the state E1 (state <+−>):

$$\Delta\phi=\Delta\phi_b+\Delta\phi_p=(1+\epsilon)[\pi-\pi/8]+\pi/24=117\pi/120$$

For the state E2 (state <++>):

$$\Delta\phi=\Delta\phi_b+\Delta\phi_p=(1+\epsilon)[\pi+\pi/8]+\pi/24=149\pi/120$$

For the state E3 (state <−+>):

$$\Delta\phi=\Delta\phi_b+\Delta\phi_p=(1+\epsilon)[-\pi+\pi/8]+\pi/24=-107\pi/120$$

For the state E4 (state <−−>):

$$\Delta\phi=\Delta\phi_b+\Delta\phi_p=(1+\epsilon)[-\pi-\pi/8]+\pi/24=-139\pi/120$$

As can be observed in FIG. 9, the modulated electrical signal S(t) 38 then takes four values S1, S2, S3 and S4, which are all different.

Hence, the first demodulated digital signal $\Sigma_p$ representative of the phase difference $\Delta\phi_p$ and of the parameter to be measured in the SAGNAC ring interferometer 20 is non-zero.

Likewise, the second demodulated digital signal $\Sigma_G$ significant of the transfer function of the modulation chain 30 is non-zero, showing that the latter is effectively incorrectly adjusted.

Hence, the measurement of the phase difference $\Delta\phi_p$ due to the parameter to be measured and that of the transfer function of the modulation chain (30) are performed independently of each other.

The measurement device of the invention is particularly well adapted to the making of a gyrometer. In this case, the parameter to be measured is a component of the rotational speed of the ring interferometer 20.

This gyrometer hence advantageously enters in the making of navigation or inertial-stabilization systems.

Such an arrangement is also well adapted to the making of a magnetic-field and electrical-current measurement device, taking advantage of the FARADAY effect.

The invention claimed is:

1. A fiber-optic measurement device (10) of the type in which a parameter to be measured generates a phase difference $\Delta\phi_p$ between two counter-propagating waves (24, 25), including:
    a light source (11),
    a fiber-optic SAGNAC ring interferometer (20), preferably single-mode, including a coil (21) and a splitting element (23), in which said two counter-propagating waves (24, 25) propagate, said ring interferometer (20) having a proper frequency $f_p$,
    an electromagnetic radiation detector (14), receiving the luminous power (37) exiting from said ring interferometer (20) and delivering a modulated electrical signal (38) representative of the luminous power (37), which is function of the total phase difference $\Delta\phi_t$ between said two counter-propagating waves (24, 25) at the output of said ring interferometer (20), a modulation chain (30) adapted to modulate said luminous power (37) exiting from said ring interferometer (20), said modulation chain (30) including:
  at least one digital/analog converter (31) adapted to process a digital control signal to deliver an analog control signal,
  an amplifier (32) adapted to process said analog control signal to deliver a modulation control voltage $V_m(t)$,
  at least one phase modulator (33) placed in said interferometer (20), which, when subjected at the input to said modulation control voltage $V_m(t)$, is adapted to generate at the output a phase-shift modulation $\phi_m(t)$, said phase-shift modulation $\phi_m(t)$ introducing between said two counter-propagating waves (24, 25) a phase-difference modulation $\Delta\phi_m(t)$ such that: $\Delta\phi_m(t)=\phi_m(t)-\phi_m(t-\Delta\tau_g)$, $\Delta\tau_g=1/(2f_p)$ being the transit-time difference between said two counter-propagating waves (24, 25) determined between said phase modulator (33) and said splitting element (23), and
signal processing means (110) including:
  an analog/digital converter (111) digitizing said modulated electrical signal (38) received from the detector (14) and representative of said power received to deliver a digital electrical signal, and
  a digital processing unit (112) adapted to process said digital electrical signal to deliver a signal function of said phase difference $\Delta\phi_p$ and of said parameter to be measured,
feedback means (120) adapted to process said signal function of said phase difference A to generate a feedback signal,
biasing means (130) adapted to generate a biasing signal,
means (140) for controlling said modulation chain (30), adapted to process said feedback signal and said biasing signal to deliver said digital control signal at the input of said modulation chain (30), such that said modulation control voltage $V_m(t)$ at the input of said phase modulator (33) is the sum of a feedback modulation voltage $V_{cr}(t)$ and a biasing modulation voltage $V_b(t)$, said phase modulator (33) being adapted, when it is subjected to said feedback modulation voltage $V_{cr}(t)$, to generate a feedback phase-shift modulation $\phi_{cr}(t)$ (121), said feedback phase-shift modulation $\phi_{cr}(t)$ (121) introducing a feedback phase-difference modulation $\Delta\phi_{cr}$ between said two counter-propagating waves (24, 25) allowing to keep at zero the sum of said phase difference $\Delta\phi_p$ and said feedback phase-difference modulation $\Delta\phi_{cr}$, and
means (150) for controlling the gain of said modulation chain (30) allowing to keep adjusted the transfer function of said modulation chain (30),
said fiber-optic measurement device (10) being characterized in that said biasing means (130) are adapted to generate said biasing signal such that said phase modulator (33) generates a biasing phase-shift modulation $\phi_b(t)$, when it is subjected to said biasing modulation voltage $V_b(t)$, said biasing phase-shift modulation $\phi_b(t)$ being the sum of:
  a first biasing phase-shift modulation component $\phi_{b1}(t)$ (34A), introducing a first biasing phase-difference modulation component $\Delta\phi_{b1}(t)$ (34) between said two counter-propagating waves (24, 25), said first biasing phase-difference modulation component $\Delta\phi_{b1}(t)$ (34) being a square-wave periodic modulation, of levels $+\pi$ and $-\pi$, at a first biasing modulation frequency $f_{b1}$ such that $f_{b1}=(2k_1+1)f_p$, $k_1$ being a natural number and $f_p$ said proper frequency, and
  a second biasing phase-shift modulation component $\phi_{b2}(t)$ (35A), introducing a second biasing phase-difference modulation component $\Delta\phi_{b2}(t)$ (35) between said two counter-propagating waves (24, 25), said second biasing phase-difference modulation component $\Delta\phi_{b2}(t)$ (35) being a periodic modulation, of extreme amplitudes $+\pi/a$ and $-\pi/a$, a being a non-zero real number such that $|a|>1$, at a second biasing modulation frequency $f_{b2}$ such that $f_{b2}=(2k_2+1)f_p$, $k_2$ being a non-zero natural number such that $k_2>k_1$, and $f_p$ said proper frequency.

2. The fiber-optic measurement device (10) according to claim 1, wherein said first biasing phase-difference modulation component $\Delta\phi_{b1}(t)$ (34) has a duty factor of 50%.

3. The fiber-optic measurement device (10) according to claim 1, wherein said second biasing phase-difference modulation component $\Delta\phi_{b2}(t)$ (35) has a duty factor of 50%.

4. The fiber-optic measurement device (10) according to claim 1, wherein $k_1=0$.

5. The fiber-optic measurement device (10) according to claim 1, wherein $k_2>2$.

6. The fiber-optic measurement device (10) according to claim 5, wherein $k_2>4$.

7. The fiber-optic measurement device (10) according to claim 1, wherein said second biasing phase-difference modulation component $\Delta\phi_{b2}(t)$ (35) is a square-wave modulation.

8. The fiber-optic measurement device (10) according to claim 1, wherein said second biasing phase-difference modulation component $\Delta\phi_{b2}(t)$ (35) is a sine-wave modulation.

9. The fiber-optic measurement device (10) according to claim 1, wherein:
  said second biasing modulation frequency $f_{b2}=(2k_2+1)f_p$ is such that $f_{b2}=(2k_{21}+1)f_{b1}$, $k_{21}$ being a non-zero natural integer, and $f_{b1}=(2k_1+1)f_p$ being the first biasing modulation frequency, and
  said first biasing phase-difference modulation component $\Delta\phi_{b1}(t)$ (34) and said second biasing phase-difference modulation component $\Delta\phi_{b2}(t)$ (35) are in phase quadrature.

10. The fiber-optic measurement device (10) according to claim 1, wherein said feedback phase-shift modulation $\phi_{cr}(t)$ (121) is a stair-step modulation.

11. The fiber-optic measurement device (10) according to claim 10, wherein said feedback phase-shift modulation $\phi_{cr}(t)$ (121) and said first biasing phase-difference modulation component $\phi_{b1}(t)$ (34A) are synchronous, each stair-step of said feedback phase-shift modulation $\phi_{cr}(t)$ (121) having a duration $\Delta\tau_g$ and said first biasing phase-shift modulation component $\phi_{b1}(t)$ (34A) being a first biasing modulation frequency $f_{b1}$ such that $f_{b1}=f_p$, $f_p$ being the proper frequency.

12. The fiber-optic measurement device according to claim 1, wherein said feedback phase-shift modulation $\phi_{cr}(t)$ falls down by $2\pi$ when it exceeds $2\pi$.

13. The fiber-optic measurement device according to claim 1, wherein:
  said digital processing unit (112) demodulates said digital electrical signal in phase with said second biasing phase-difference modulation component $\Delta\phi_{b2}(t)$ (35) independently of the first biasing phase-difference modulation component $\Delta\phi_{b1}(t)$ (34), and
  said means (150) for controlling the gain of said modulation chain (30) demodulate said digital electrical signal so as to provide a signal function of the transfer function of said modulation chain (30).

14. A gyrometer, characterized in that it is compliant with the measurement device (10) of claim 1, the parameter to be measured being a component of the rotational speed of the ring interferometer (20).

* * * * *